United States Patent
Bahat-Treidel et al.

(10) Patent No.: US 8,866,191 B2
(45) Date of Patent: Oct. 21, 2014

(54) HEMT SEMICONDUCTOR COMPONENT WITH FIELD PLATES

(75) Inventors: Eldat Bahat-Treidel, Berlin (DE); Victor Sidorov, Berlin (DE); Joachim Wuerfl, Zeuthen (DE)

(73) Assignee: Forschungsverbund Berlin E.V., Berlin (DE)

(*) Notice: Subject to any disclaimer, the term of this patent is extended or adjusted under 35 U.S.C. 154(b) by 528 days.

(21) Appl. No.: 12/449,700

(22) PCT Filed: Feb. 21, 2008

(86) PCT No.: PCT/EP2008/052131
§ 371 (c)(1),
(2), (4) Date: Sep. 29, 2010

(87) PCT Pub. No.: WO2008/101989
PCT Pub. Date: Aug. 28, 2008

(65) Prior Publication Data
US 2011/0221011 A1 Sep. 15, 2011

(30) Foreign Application Priority Data
Feb. 22, 2007 (DE) .................. 10 2007 010 562

(51) Int. Cl.
H01L 29/778 (2006.01)
H01L 29/66 (2006.01)
H01L 29/40 (2006.01)
H01L 29/47 (2006.01)
H01L 29/06 (2006.01)

(52) U.S. Cl.
CPC .............. H01L 29/404 (2013.01); H01L 29/47 (2013.01); H01L 29/7786 (2013.01); H01L 29/0619 (2013.01)
USPC ...... 257/192; 257/194; 257/195; 257/E29.246

(58) Field of Classification Search
CPC .......................... H01L 29/404; H01L 29/66462
USPC .................. 257/194, 195, 487, 488, E29.246, 257/E29.247, 192
See application file for complete search history.

(56) References Cited

U.S. PATENT DOCUMENTS 4,947,232 A 8/1990 Ashida et al.
5,434,445 A * 7/1995 Ravanelli et al. ............. 257/488

(Continued)

FOREIGN PATENT DOCUMENTS

JP 62-173764 A 7/1987
JP 10-335353 A 12/1998

(Continued)

OTHER PUBLICATIONS

English translation of International Preliminary Examination Report dated Sep. 17, 2009 for PCT/EP2008/052131, 8 pgs.

(Continued)

*Primary Examiner* — Jerome Jackson, Jr.
*Assistant Examiner* — Paul Budd
(74) *Attorney, Agent, or Firm* — Christie, Parker & Hale, LLP

(57) ABSTRACT

A transistor in which the electric field is reduced in critical areas using field plates, permitting the electric field to be more uniformly distributed along the component, is provided, wherein the electric field in the active region is smoothed and field peaks are reduced. The semiconductor component has a substrate with an active layer structure, a source contact and a drain contact located on said active layer structure. The source contact and the drain contact are mutually spaced and at least one part of a gate contact is provided on the active layer structure in the region between the source contact and the drain contact, a gate field plate being electrically connected to the gate contact. In addition, at least two separate field plates are placed directly on the active layer structure or directly on a passivation layer.

6 Claims, 7 Drawing Sheets

(56) References Cited

U.S. PATENT DOCUMENTS

| | | | |
|---|---|---|---|
| 6,507,051 B1 * | 1/2003 | Hara | 257/194 |
| 6,586,781 B2 * | 7/2003 | Wu et al. | 257/194 |
| 7,256,432 B2 * | 8/2007 | Okamoto et al. | 257/192 |
| 7,420,225 B1 * | 9/2008 | Wanke et al. | 257/192 |
| 2005/0110042 A1 * | 5/2005 | Saito et al. | 257/192 |
| 2005/0161761 A1 * | 7/2005 | Hatade | 257/487 |
| 2005/0253168 A1 * | 11/2005 | Wu et al. | 257/192 |
| 2007/0114569 A1 * | 5/2007 | Wu et al. | 257/194 |
| 2007/0132021 A1 * | 6/2007 | Kunii et al. | 257/344 |
| 2008/0073670 A1 * | 3/2008 | Yang et al. | 257/194 |
| 2008/0128752 A1 * | 6/2008 | Wu | 257/194 |
| 2009/0230430 A1 * | 9/2009 | Miyamoto et al. | 257/192 |

FOREIGN PATENT DOCUMENTS

| | | |
|---|---|---|
| JP | 2004-214471 A | 7/2004 |
| JP | 2006-351753 A | 12/2006 |
| JP | WO 2006/132419 | * 12/2006 |
| WO | WO03/012854 A1 | 2/2003 |
| WO | WO 2006/098801 A1 | 9/2006 |
| WO | WO2006/098801 A1 | 9/2006 |

OTHER PUBLICATIONS

Search Report and Preliminary Examination Report for International Application No. PCT/EP2008/052131, dated Aug. 1, 2008.

Xing, et al., High Breakdown Voltage AlGaN—GaN HEMTs Achieved by Multiple Field Plates, IEEE Electron Device Letters, vol. 25, No. 4, Apr. 2004, pp. 161-163.

Lee et al., High Breakdown Voltage GaN Schottky Barrier Diode Employing Floating Metal Rings on AlGaN/GaN Hetero-junction, Proceedings of the 17th International Symposium on Power Semiconductor Devices & IC's, May 2005, 4 pgs.

English Machine translation for Japanese Patent Application No. 10-335353 A issued on Dec. 18, 1998, pp. 1-19.

English Machine translation for Japanese Patent Application No. 2004-214471 A issued on Jul. 29, 2004, pp. 1-56.

English Machine translation for Japanese Patent Application No. 2006-351753 A issued on Dec. 28, 2006, pp. 1-12.

* cited by examiner

HEMT SEMICONDUCTOR COMPONENT WITH FIELD PLATES

CROSS-REFERENCE TO RELATED APPLICATIONS

This application is a National Phase Patent Application of International Application Number PCT/EP2008/052131, filed on Feb. 21, 2008, which claims priority of German Patent Application No. 10-2007-010-562.4, filed on Feb. 22, 2007, the content of which is incorporated by reference.

BACKGROUND

The present invention relates to a semiconductor component and a method of manufacturing the same, in particular, the present invention relates to a transistor wherein the electric field is reduced (controlled) in the active region (channel) in critical areas using field plates and thereby the electric field is distributed more uniformly along the component, whereby the power of the component can be improved.

Field plates are usually employed in a large selection of semiconductor components like HEMTs, MISFETs, MOSFETs etc. The field plates are required to control the electric field in critical areas (channel) and thereby accomplish certain component characteristics (e.g. greater breakdown strength or improved linearity). The electric field is distributed more uniformly along the component (channel), whereby the power of the component can be reduced.

Field plates can be combined with different potential sources and electrodes or can stand alone without being connected to a defined potential (so-called "unearthed", "floating" or "free-of-ground"). Although field plates are useful for reducing electric field gradients, they have a fundamental disadvantage in that they increase the capacitances of the component and deteriorate the power in the high-frequency region since they lead to a reduced cutoff frequency due to the increased component capacitance.

A uniform field plate (i.e. exactly one field plate disposed in the area of the channel), for example a field effect transistor with a uniform field plate connected to the gate potential, generates two separate peaks of the electric field along the channel, one peak being near the drain-side edge and the other peak being near the gate-side edge of the drain electrode. This means that the field in the component is still highly concentrated locally and exhibits very high absolute values. To overcome this problem and smooth the field peaks, two field plates stacked on top of each other have been proposed in US 2005/0253168 and in X. Huili et al. ("High breakdown voltage AlGaN—GaN HEMTs achieved by multiple field plates," Electron Component Letters, IEEE, vol. 25, no. 4, pp. 161-163, 2004).

A disadvantage of the stacked field plates proposed in the state of the art is the high manufacturing cost of the component due to the large number of necessary process steps as well as the error-proneness due to the necessity of a very exact alignment of the field plates to each other.

SUMMARY

Therefore it is an object of the present invention to provide a transistor and a method for manufacturing the same in which the electric field in the active region is smoothed (or field peaks are reduced), wherein the component can be manufactured more cheaply and more easily and furthermore a higher process yield can be achieved. Furthermore, adaptations of the semiconductor component to different requirements concerning the distribution of the electric field should be possible in an especially simple way.

These problems are solved according to the invention by the features of the independent claims 1 and 10. Preferred embodiments of the invention are contained in the dependent claims.

The idea of the invention lies in generating a plurality of separate field plates (also called fingers) by a common processing step, the field plates distributing the electric field more uniformly along the channel. Thereby a transistor with relatively small (i.e. smoothed) field peaks (in the area of the drain-side edge/gate-side edge) and at the same time low capacitance can be manufactured particularly easily.

Separate means that the field plates made of an electrically conductive material are not directly in (physical) contact with each other. Thus, the field plates are not directly electrically connected to each other. It is conceivable, however, that the field plates are indirectly electrically connected to each other, for example via the gate electrode or the gate pad. Through the design according to the invention, field peaks at the drain-side edge of the gate contact and at the gate-side edge of the drain contact are reduced efficiently. Preferably, the plurality of separate field plates (i.e. of at least 2 field plates) is disposed periodically with respect to each other along the channel. It is also possible, however, that the plurality of separate field plates is not disposed periodically with respect to each other. Preferably, the individual field plates do not overlap in a projection onto the channel perpendicular to the carrier substrate of the transistor. Preferably, according to the invention between 2 and 50 separate field plates, more preferably between 2 and 10 separate field plates, are disposed in the area of the channel (active region).

The field plates are preferably fixed using lithography. However, alternative methods for high-resolution depositing and structuring of electrically conductive material can also be used. Independently of the method used, at least two separate field plates are formed at the same time.

The field plates are made of an electrically conductive material, preferably a layer structure of titanium/gold (particularly preferably 30 nm/500 nm) or aluminum. Alternatively, other noncorrosive metals can also be used. Each of the fingers (=each of the plurality of field plates) of the conductive material can be connected to a different electrode (for example gate, source, drain) of the transistor (preferably HEMT, MISFET, MOSFET) or can alternatively not be connected to any electrode, in this case the field plate is called "unearthed" (floating). Thereby, according to the invention many degrees of freedom for optimizing the field distribution under the field plate structure result. The optimal configuration can preferably be determined using physically oriented component simulation. A particular advantage lies in generating the field plate structure and the selective assignment of the individual fingers of the field plate structure with a single standard (lithographic) process. Furthermore, it is advantageous to be able to address the fingers of the configuration individually.

The length of the channel (i.e. the distance between source and drain contact) is preferably between 3 and 100 µm, more preferably between 3 and 12 µm. The length of the field plates along the channel (that is, in the direction of the current flow) is preferably between 1 µm and 100 µm, more preferably between 3 µm and 12 µm. The width of the field plates perpendicular to the channel is preferably between 50-500 µm.

The field plate structure is preferably (at least in part) manufactured during the gate layering process, during the gate field plate layering process or during both processes. In the first case, the fingers of the field plate mesh are implemented in the same plane as the actual gate structure, for example with electron beam lithography. In the second case, the fingers of the field plate mesh are manufactured in an optional additional metallization plane. The outstanding advantage of the proposed field plate technology lies in its simplicity, i.e. without introducing additional processing planes. Thereby a robust and reproducible process can be guaranteed, since for example adjustment problems which inevitably occur with stacked field plates are dispensed with completely.

The field plate structure according to the invention allows every individual field plate finger to be connected with different electric potentials like the source, drain or gate potential or to leave it drifting (floating), preferably in the case of a FET design. Connecting the individual field plates of the field plate structure to different external potentials allows for a tunable field plate structure wherein the internal electric field can be influenced by the layout of the field plate structure whereas the method of manufacturing stays nearly the same. In this way the characteristics of the component can be optimized individually and can be better adapted for the specific needs.

Besides the simplicity of the method according to the invention, a field plate structure has the advantage of a smaller capacitance than a uniform field plate due to the dielectric distance between the mesh lines. The reduction of the capacitance is preferably achieved by "ungrounded" field plate fingers and/or a low ratio of the line distance raster ($L_s/L_f > 1$). Preferably, the ratio of the distance between two neighboring field plates and the length of the field plate fingers is greater than 1.5, more preferably greater than 2 and even more preferably greater than 3. The field plate structure according to the invention is therefore also useable for high-frequency applications (HEMT).

The method according to the invention includes the following method steps: providing a substrate with an active layer structure disposed thereon, comprising at least one layer made of a semiconducting material, the active layer structure being connected to a source electrode and a source contact and a drain electrode and a drain contact, and the source contact and the drain contact being spaced apart from each other; depositing a gate contact on the active layer structure, wherein at least a part of the gate contact is disposed in the area between the source contact and the drain contact; depositing a gate field plate on the gate contact, wherein the gate field plate is electrically (and physically) connected to the gate contact, wherein additionally at least two separate field plates are formed on the active layer structure at the same time.

Preferably, the field plates are formed using a photolithographic method. Preferably, the additional field plates (fingers) are formed simultaneously with the process for forming the gate contact and/or simultaneously with the process for forming the gate field plate. Preferably, a passivation layer is deposited on the active layer structure before depositing the at least two additional field plates, and the at least two additional field plates are (simultaneously) deposited on the passivation layer. Preferably, the at least two field plates are formed in a stripe shape and parallel to each other. Preferably, the active layer structure has a first layer made of a first semiconducting material and a second layer made of a second semiconducting material, wherein the band gap of the first semiconducting material is different from the band gap of the second semiconducting material, and the first semiconducting material and the second semiconducting material are chosen such that a two-dimensional electron gas is formed in the boundary layer between the first layer and the second layer.

Preferably, at least two field plates are connected to different electric potentials. Preferably, at least one field plate is connected to the drain contact and/or at least one field plate is connected to the gate contact and/or at least one field plate is connected to the source contact. Preferably, at least one field plate is disposed free-of-ground ("unearthed"). Preferably, the gate field and the at least two additional field plates are covered with a protective film.

The passivation layer and/or the protective film preferably have a layer thickness between 100 nm and 300 nm. The passivation layer and/or the protective film are preferably made of silicon dioxide, aluminium oxide or silicon nitride.

Preferably, at least two of the additional field plates are formed as delta layers, i.e. in the cross-section along the channel the additional field plates have a length (lateral) which is smaller than the height (vertical). Preferably, the height is more than twice as large as the length of the field plates. Thus, the capacitance of the component can be further reduced. The minimal length (lateral extension along the channel) is downwardly limited by the resolution of the available process technology (for example lithography).

The semiconductor component according to the invention includes the following: a substrate with an active layer structure disposed thereon, comprising at least one layer made of a semiconducting material, a source contact and a drain contact being disposed on the active layer structure and the source contact and the drain contact being spaced apart from each other; a gate contact, at least a part of the gate contact being disposed on the active layer structure in the area between source contact and drain contact, and a gate field plate electrically connected to the gate contact, wherein additionally at least two separate field plates are disposed on the active layer structure.

Preferably, the at least two field plates are formed in a stripe shape and parallel to each other. Preferably, at least two additional field plates are disposed next to each other and directly on the active layer (or directly on a passivation layer present on the active layer). Thus, a passivation layer is preferably provided between the active layer structure and at least two additional field plates. Preferably, at least two additional field plates are disposed next to each other and directly on the passivation layer. Preferably, the active layer structure has a first layer made of a first semiconducting material and a second layer made of a second semiconducting material, wherein the band gap of the first semiconducting material is different from the band gap of the second semiconducting material, and the first semiconducting material and the second semiconducting material are chosen such that a two-dimensional electron gas forms in the boundary layer between the first layer and the second layer.

Preferably, at least two field plates are connected to different electric potentials. Preferably, at least one field plate is connected to the drain contact and/or at least one field plate is connected to the gate contact and/or at least one field plate is connected to the source contact. Preferably, at least one field plate is disposed unearthed (or free-of-ground or floating, i.e. not connected to a specific potential).

Preferably, the gate field and the at least two field plates are coated with a protective film.

BRIEF DESCRIPTION OF THE DRAWINGS

In the following, the invention is explained in more detail by means of exemplary embodiments illustrated in the figures, of which.

DETAILED DESCRIPTION

Figure 1:
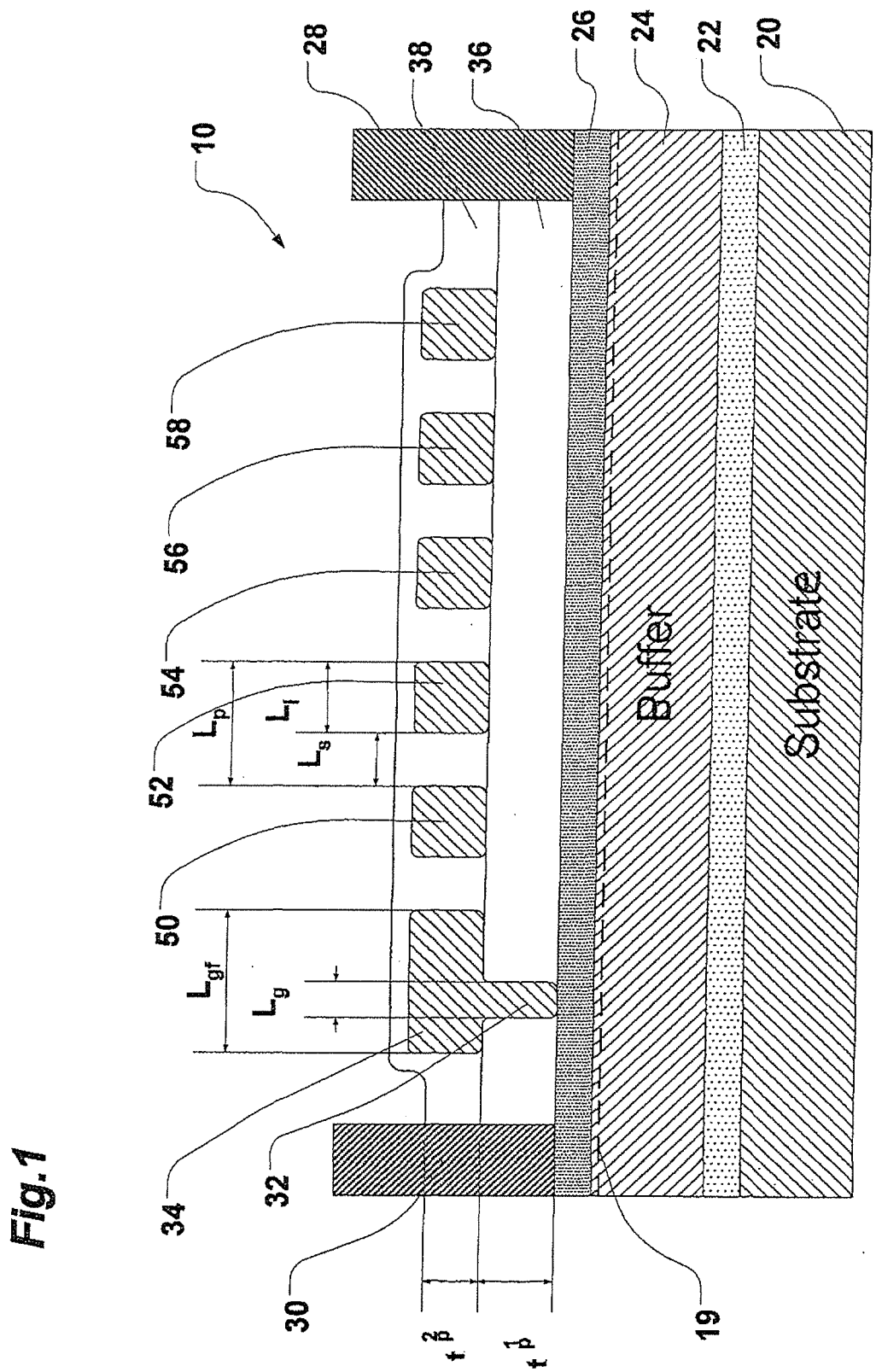
FIG. 1 shows a High Electron Mobility Transistor with a field plate mesh according to the invention (manufactured in one metallization plane) in a schematic cross-sectional representation.
Figure 2:
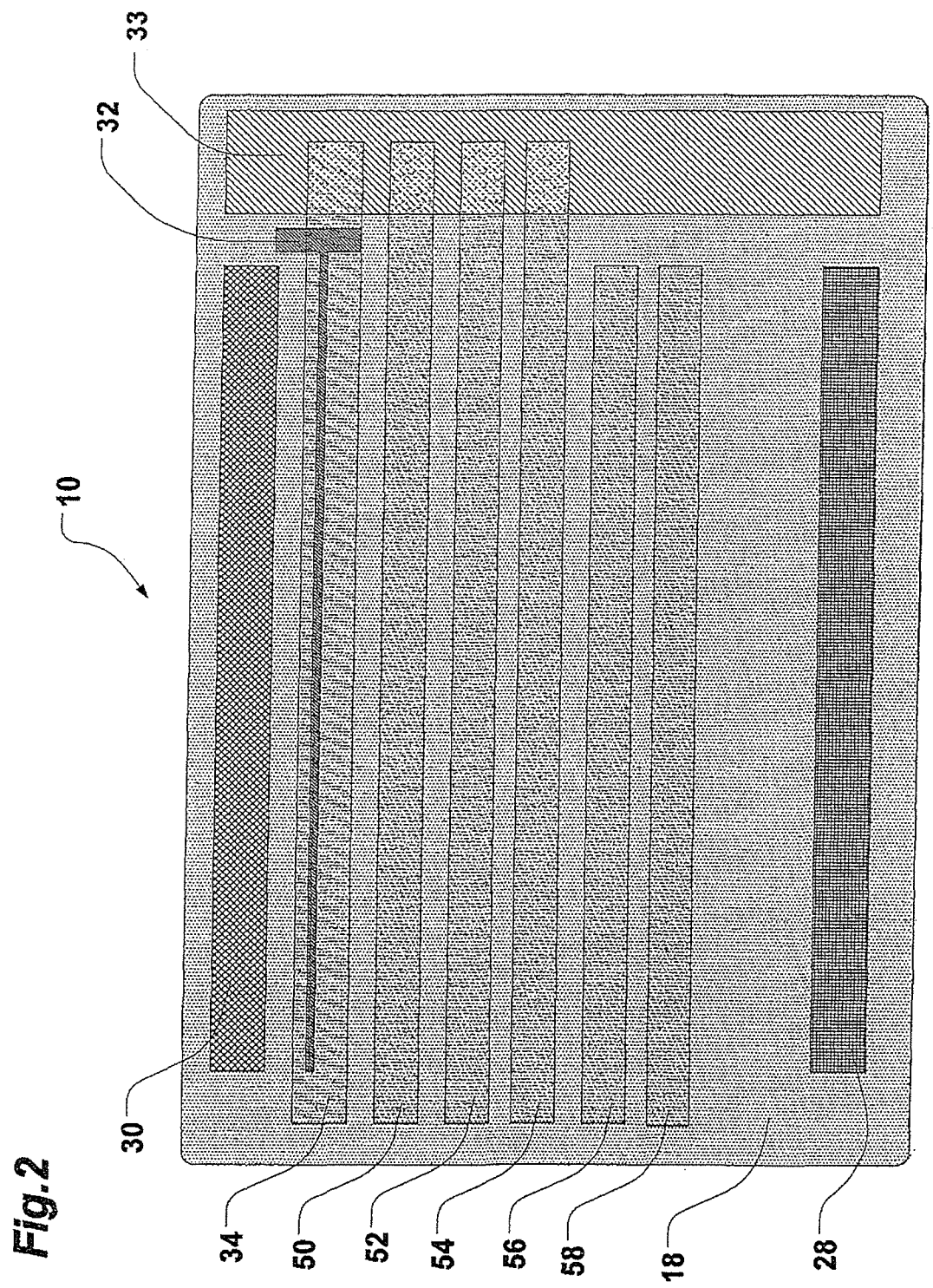
FIG. 2 shows a High Electron Mobility Transistor with a field plate mesh according to the invention in a top view, three fingers being connected with the gate electrode and two fingers being disposed drifting.

FIG. 1 and FIG. 2 show a High Electron Mobility Transistor with a field plate mesh according to the invention manufactured in one metallization plane in a cross-sectional representation/in top view.

A nucleation layer 22 is deposited on a substrate 20. Subsequently, a buffer layer 24 made of a semiconducting material is deposited thereon. A barrier layer 26 made of a semiconducting material is deposited on the buffer layer 24. The buffer layer 24 and the barrier layer 26 are formed with a significantly different band gap and different Fermi level, so that a two-dimensional electron gas forms as a channel between source 30 and drain 28, wherein source 30 and drain 28 are disposed on the barrier layer 26. In order to balance this different Fermi energy and in the case of GaN components because of different spontaneous and piezoelectric polarization in the layers 24 and 26, the electrons concentrate at the boundary layer between the layers 24 and 26. In the conduction band, an energy minimum forms which is relatively sharply restricted to the boundary layer. Parallel to the boundary layer, the electrons have a high mobility. At moderate operating voltages, high electric fields occur mainly at the drain-side edge of the gate, since the drain potential is practically applied under this gate edge because of the high channel conductivity. Only at even higher operating voltages a second field peak forms at the drain contact.

However, the invention is not limited to a HEMT, rather the invention can be utilized for all kinds of field effect transistors like MISFETs and MOSFETs. Accordingly, the channel can alternatively also be formed by a single semiconducting layer.

In the following, a passivation layer 36, made of $SiO_2$, $Al_2O_3$ for example, is formed with a layer thickness between 100-300 nm.

A recess (discontinuity) is formed in the passivation layer 36 using standard techniques (for example lithography). The gate 32 is deposited in the recess. Subsequently, the gate field plate 34 and the separate field plates 50, 52, 54, 56, and 58 are deposited in a single processing step. The gate field plate 34 and three of the fingers 50, 52, 54 are electrically connected to the gate pad electrode 33, and two are "unearthed" fingers 56, 58, i.e. they are not connected to any defined potential (like source, drain or gate).

The common processing step can be carried out using standard techniques like lithography, but also using alternative structuring methods. It is crucial that several separate field plates (that are not connected to gate 32) are deposited on the passivation layer 36 at the same time.

Finally, a protective layer 38 that covers the gate field plate 34 and the separate field plates 50, 52, 54, 56, and 58 is deposited.

Figure 3:
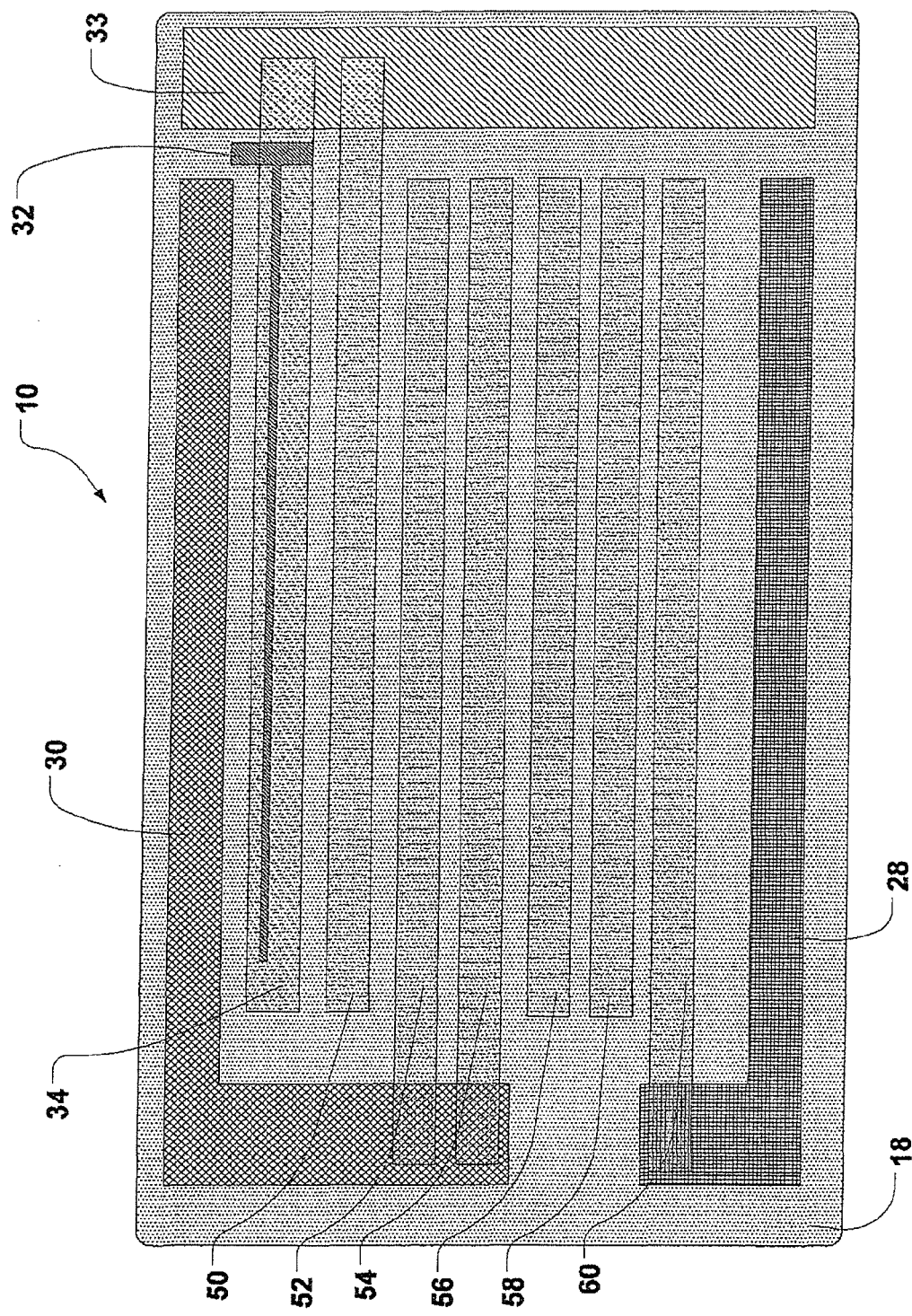
FIG. 3 shows a High Electron Mobility Transistor with a field plate mesh according to the invention, two fingers being connected to the gate electrode, two fingers to the source electrode and one finger to the drain electrode as well as two fingers being disposed "unearthed"

FIG. 3 shows another alternative exemplary embodiment of a HEMT with a field plate structure according to the invention. In this case, different fingers of the field plate structure are assigned to different electrodes. Finger 50 is connected to the gate pad 33, the fingers 52 and 54 are connected to the source pad 30, the fingers 56 and 58 are unearthed and finger 60 is connected to the drain pad 28. In order to optimize the field distribution under the field plate structure, it is also possible to connect a part of the field plate mesh with an arbitrary external potential.

Figure 4:
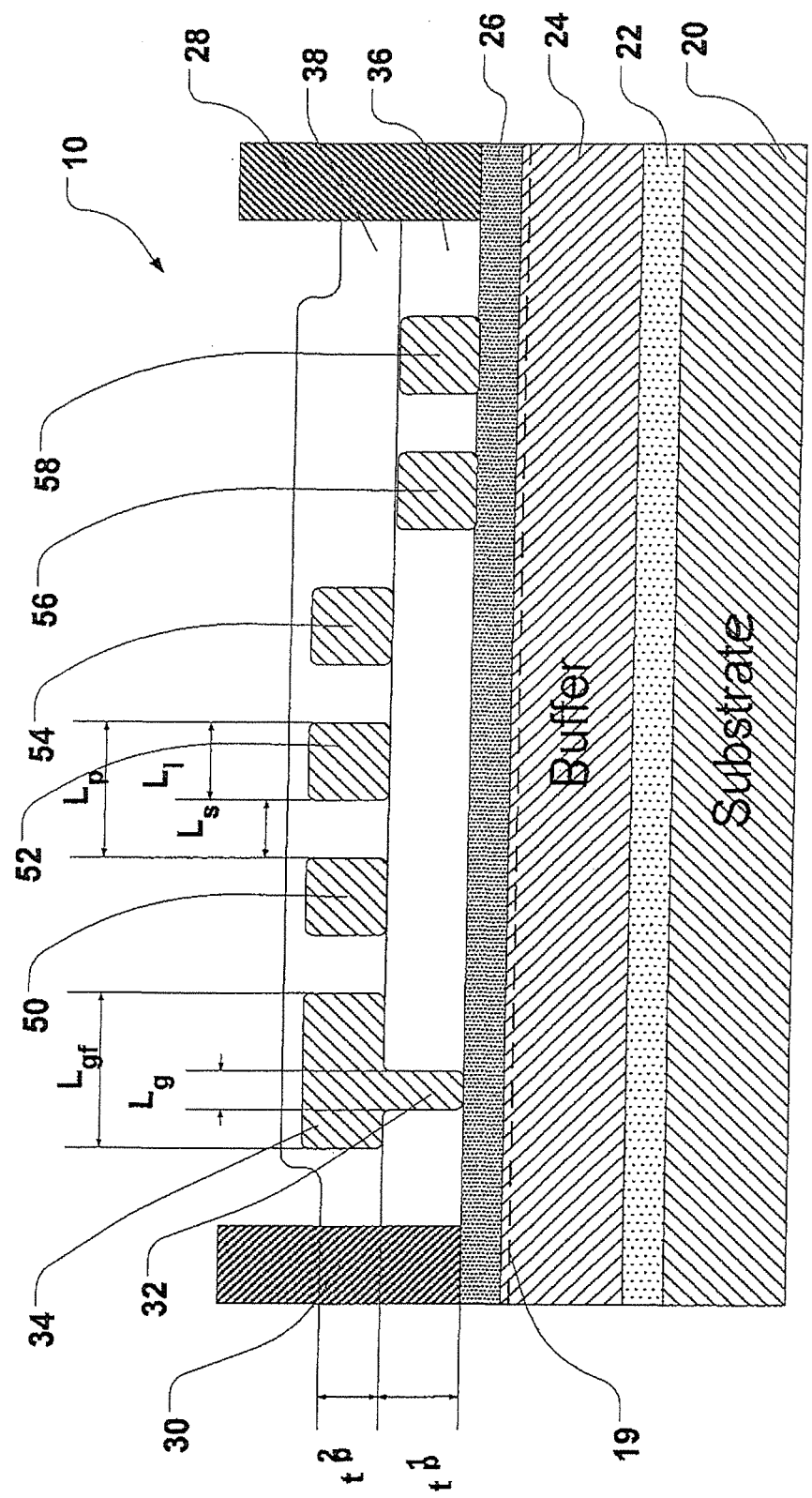
FIG. 4 shows a High Electron Mobility Transistor with a field plate mesh according to the invention in a schematic cross-sectional representation, manufactured in two different metallization planes.

FIG. 4 shows a HEMT with a field plate mesh according to the invention in an alternative embodiment. Here, the fingers 56 and 58 of the field plate mesh are manufactured in an optional additional metallization plane. This means that the passivation layer 36 is patterned accordingly.

Figure 5:
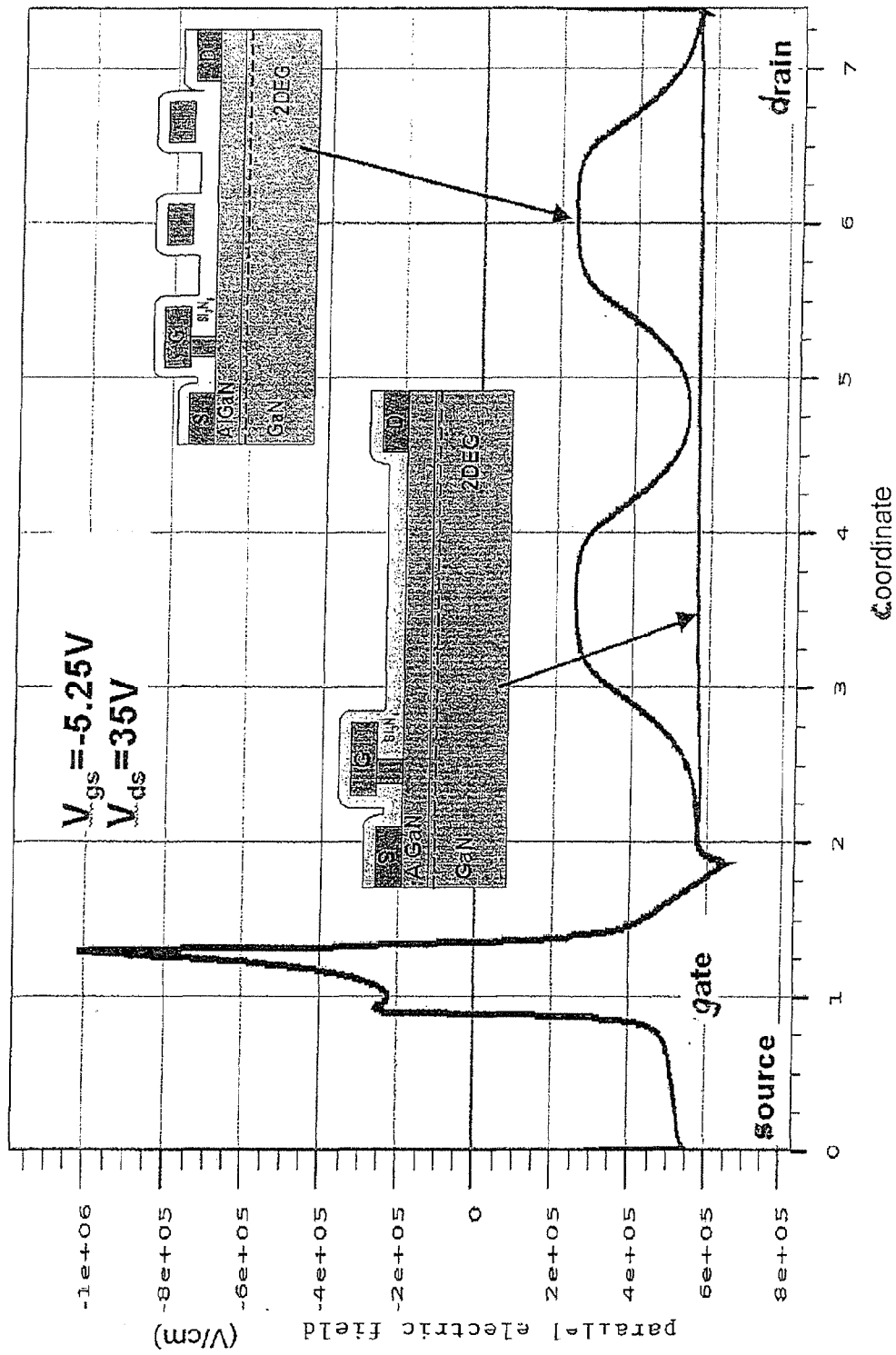
FIG. 5 shows a schematic representation of the distribution of the electric field in the channel region of a HEMT with and without field plate meshes (field plate structure)

FIG. 5 shows a schematic representation of the distribution of the electric field in the channel area of a HEMT according to FIG. 1. (with field plate structure) in comparison to a HEMT identical in construction but without field plate structure. In the case of a blocked transistor and high blocking voltage directly under the field plate, the field plates provide for an additional electric field in the channel area between gate and drain and thereby limit the field peak immediately at the drain-side edge of the gate structure.

Figure 6:
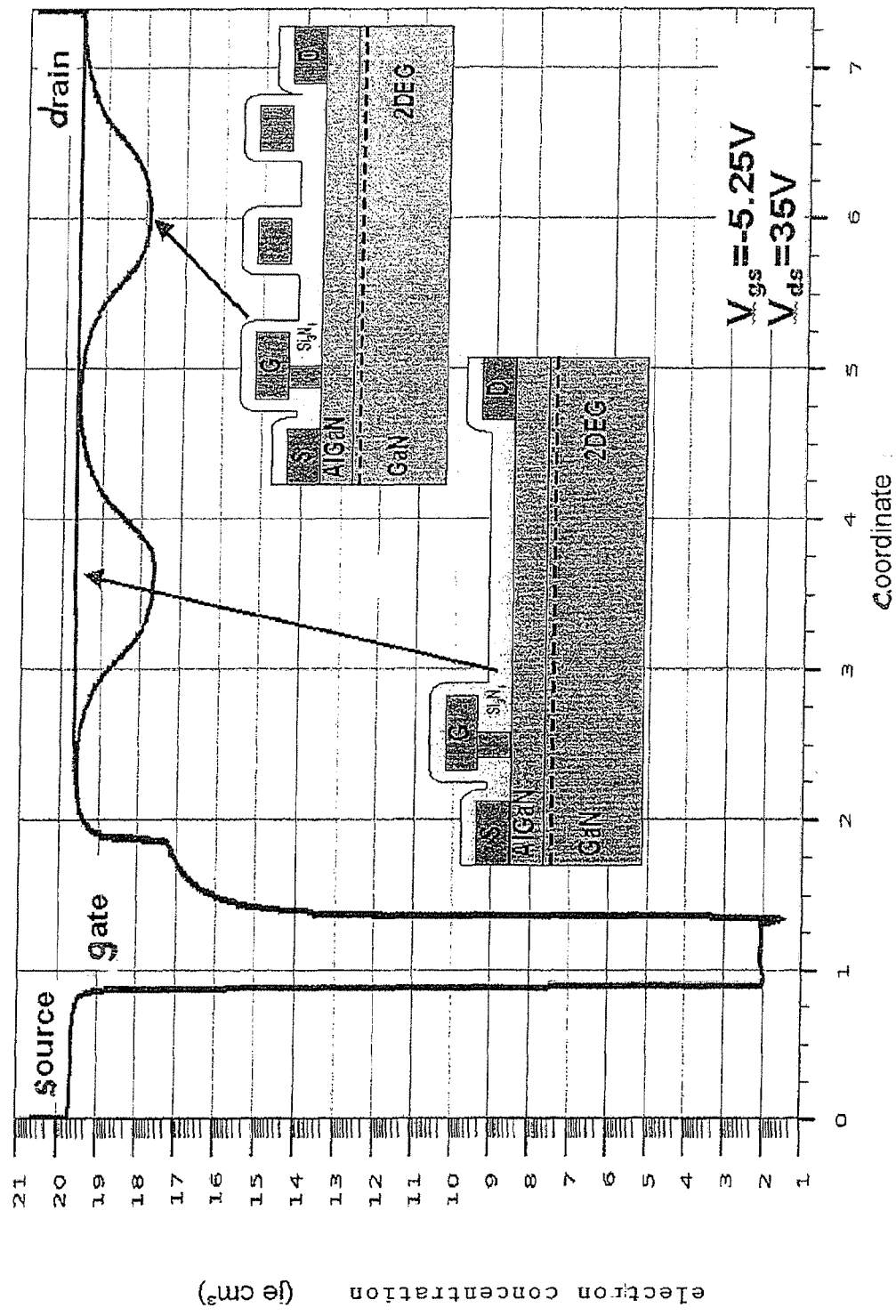
FIG. 6 shows a schematic representation of the electron concentration in the 2DEG between the gate and the drain electrode resulting from the field distribution underlying FIG. 5.

FIG. 6 shows the electron concentration in the 2DEG between the gate and the drain electrode resulting from the field distribution underlying FIG. 5. The channel regions which are additionally depleted due to the field plate mesh can be clearly discerned. These depleted areas provide for an additional voltage drop along the channel and thereby increase the breakdown voltage strength.

Figure 7:
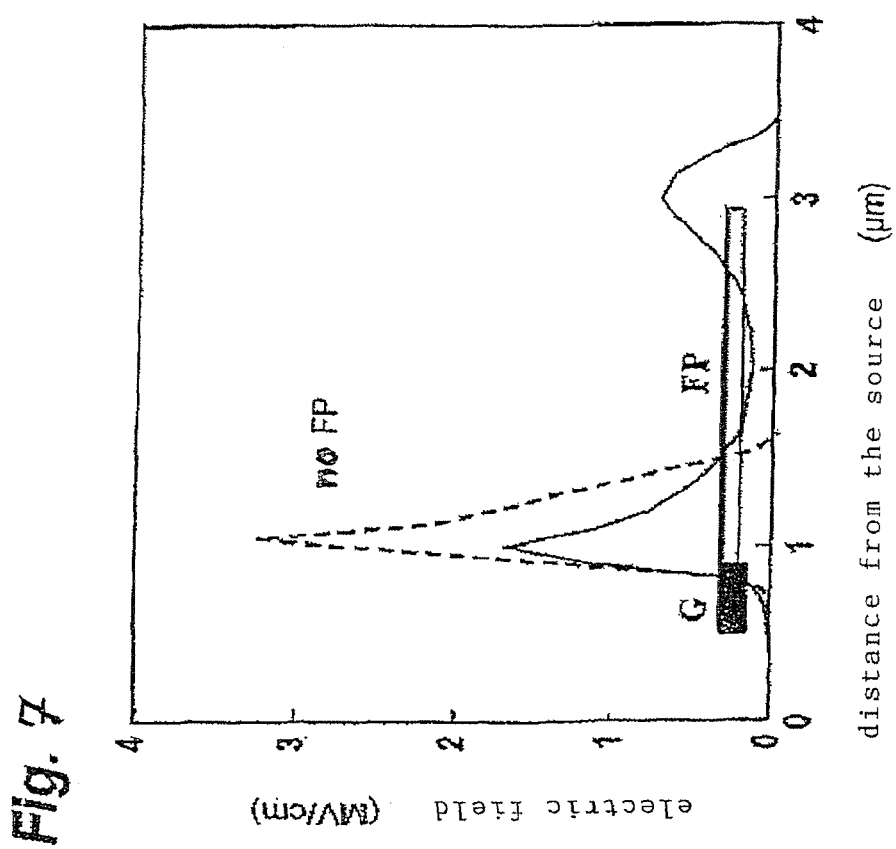
FIG. 7 shows a schematic representation of a simulated distribution of the electric field in the 2-DEG field in source-drain direction with and without field plate mesh.

FIG. 7 shows a schematic representation of a simulated distribution of the electric field in the 2-DEG field (two-dimensional electron gas) in source-drain direction with and without field plate structure. Here, too, the field plate structure reduces the peak of the electric field at the drain-side edge of the gate.

Although the transistor according to the invention was illustrated using a HEMT in the preferred embodiment, the above explanations are valid analogously for other transistor types, in particular FET applications like MISFET and MOSFET. The transistor according to the invention can be utilized as a single transistor, as an array arrangement of a plurality of transistors of the same kind (plurality of fingers) or also in an integrated circuit.

LIST OF REFERENCE SIGNS

10 HEMT component
18 active area
19 2DEG
20 substrate
22 nucleation layer
24 buffer layer
26 barrier layer 28 drain electrode and drain pad
30 source electrode and source pad
32 gate
33 gate electrode and gate pad
34 gate field plate
36 passivation layer
38 protective film
50 field plate
52 field plate
54 field plate
56 field plate
58 field plate
60 field plate
$L_p$ field plate: length of the periodic arrangement
$L_s$ distance between two neighboring field plates
$L_f$ length of the field plate
$L_{gf}$ length of the gate field plate
$L_g$ gate length
$t_{p1}$ thickness of the passivation layer
$t_{p2}$ thickness of the protective film

The invention claimed is:

1. A semiconductor component, comprising:
a substrate with an active layer structure disposed thereon, comprising at least one layer made of a semiconducting material, a source contact and a drain contact being disposed on the active layer structure and the source contact and the drain contact being spaced apart from each other,
a gate contact, at least a part of the gate contact being disposed on the active layer structure in an area between the source contact and the drain contact,
a gate field plate electrically connected to a gate electric potential of the gate contact and disposed directly on a passivation layer disposed on the active layer structure, and
at least two separate field plates of which at least one separate field plate is disposed directly on the active layer structure, wherein the passivation layer is patterned accordingly.

2. The semiconductor component according to claim 1, wherein the at least one separate field plate is at least one of at least two field plates formed in a stripe shape and parallel to each other.

3. The semiconductor component according to one of claims 1 and 2, wherein
the active layer structure has a first layer made of a first semiconducting material and a second layer made of a second semiconducting material, and the band gap of the first semiconducting material is different from the band gap of the second semiconducting material and/or the spontaneous or piezoelectric polarization of the first semiconducting material is different from the spontaneous or piezoelectric polarization of the second semiconducting material, and the first semiconducting material and the second semiconducting material are chosen such that a two-dimensional electron gas forms in a boundary layer between the first layer and the second layer.

4. The semiconductor component according to one of claims 1 and 2, wherein
the at least one other separate field plate of the at least two separate field plates is connected to the drain potential or is connected to the source potential.

5. The semiconductor component according to one of claims 1 and 2, wherein
the at least one separate field plate is disposed unearthed directly on the active layer structure.

6. The semiconductor component according to one of claims 1 and 2, wherein
the gate field plate and the at least one separate field plate are coated with a protective film.

* * * * *